(12) United States Patent
Gurrum et al.

(10) Patent No.: US 8,304,897 B2
(45) Date of Patent: Nov. 6, 2012

(54) THERMAL INTERFACE MATERIAL DESIGN FOR ENHANCED THERMAL PERFORMANCE AND IMPROVED PACKAGE STRUCTURAL INTEGRITY

(75) Inventors: Siva Prakash Gurrum, Dallas, TX (US); Paul J Hundt, Garland, TX (US); Vikas Gupta, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 13/099,145

(22) Filed: May 2, 2011

(65) Prior Publication Data
US 2011/0204506 A1 Aug. 25, 2011

Related U.S. Application Data

(62) Division of application No. 12/038,005, filed on Feb. 27, 2008, now Pat. No. 7,956,456.

(51) Int. Cl.
*H01L 23/34* (2006.01)

(52) U.S. Cl. ........ 257/707; 257/706; 257/717; 257/720; 257/E33.076; 257/E31.131; 257/E23.051; 257/E23.098; 257/E23.101

(58) Field of Classification Search ............. 257/717, 257/720, 706, 707, E33.075, E31.131, E23.051, 257/E23.098, E23.101
See application file for complete search history.

(56) References Cited

U.S. PATENT DOCUMENTS

| | | | |
|---|---|---|---|
| 2003/0077478 A1* | 4/2003 | Dani et al. | 428/673 |
| 2005/0056365 A1* | 3/2005 | Chan | 156/307.7 |
| 2008/0124841 A1* | 5/2008 | Too et al. | 438/118 |
| 2008/0274349 A1* | 11/2008 | Chiu et al. | 428/327 |
| 2009/0166852 A1* | 7/2009 | Hu | 257/707 |

* cited by examiner

*Primary Examiner* — Long Tran
(74) *Attorney, Agent, or Firm* — Steven A. Shaw; W. James Brady; Frederick J. Telecky, Jr.

(57) ABSTRACT

An electronic package 100 comprising a semiconductor device 105, a heat spreader layer 110, and a thermal interface material layer 115 located between the semiconductor device and the heat spreader layer. The thermal interface material layer includes a resin layer 120 having heat conductive particles 125 suspended therein. A portion of the particles are exposed on at least one non-planar surface 135 of the resin layer such that the portion of exposed particles 130 occupies a majority of a total area of a horizontal plane 140 of the non-planar surface.

14 Claims, 8 Drawing Sheets

THERMAL INTERFACE MATERIAL DESIGN FOR ENHANCED THERMAL PERFORMANCE AND IMPROVED PACKAGE STRUCTURAL INTEGRITY

TECHNICAL FIELD

This application is a division of U.S. patent application Ser. No. 12/038,005 filed on Feb. 27, 2008, now U.S. Pat. No. 7,956,456. The disclosure is directed, in general, to electronic packages such as used in electrical devices, and their method of manufacture.

BACKGROUND

After the manufacture of a semiconductor device, there remains the need to package and mount the device to a surface to provide connections to other devices, and to protect the device from damage. Additionally, the mounting surface and protective covering can provide a means to dissipate heat from the device.

It is increasingly important to have efficient heat transfer from semiconductor devices, as device power densities increase and device package form-factors decrease. It is also important to avoid damaging, and to prevent uncoupling of, the semiconductor devices from other components of the package. Such uncoupling can be caused by, e.g., mechanical or thermal stresses imposed on the device package. Existing methods of coupling devices to a package involve the use of flexible materials, which can tolerate mechanical or thermal stresses, but which have poor heat transfer, or, the use of brittle materials, which have good heat transfer, but cannot tolerate mechanical or thermal stresses.

SUMMARY

The disclosure provides an electronic package. The package comprises a semiconductor device, a heat spreader layer, and a thermal interface material layer located between the semiconductor device and the heat spreader layer. The thermal interface material layer includes a resin layer having heat conductive particles suspended therein. A portion of the particles are exposed on at least one non-planar surface of the resin layer such that the portion of exposed particles occupy a majority of a total area of a horizontal plane of the non-planar surface.

Another aspect of the disclosure is an electrical device having the electronic package. The electronic package includes a semiconductor device mounted to a mounting body and a lid surrounding the semiconductor device and over the mounting body. The thermal interface material layer is located between the semiconductor device and at least one of the lid or mounting body. In addition to the above-described resin layer, the thermal interface material layer includes an outer solder layer contacting the non-planar surface. The outer solder layer also contacts one of the semiconductor device, lid, or mounting body. The device also comprises connective structures. The connective structures are electrically coupled to the semiconductor device to thereby interconnect the package to electronic components mounted on a substrate.

Still another aspect of the disclosure is a method of manufacturing the electronic package that comprises attaching a semiconductor device to a heat spreader layer. Attaching includes applying a thermal interface material having the above-described resin layer to a component surface of one of the semiconductor device or the heat spreader layer. Attaching also includes contacting the other of the semiconductor device or the heat spreader layer to the thermal interface material.

Yet another aspect of the disclosure is a method of forming a thermal interface material layer. The method comprises suspending heat conductive particles in a resin to form a particle-resin mixture, and forming a layer of the particle-resin mixture. The layer has a planar surface. The method also comprises etching the planar surface to form a non-planar surface and thereby expose a portion of the particles located at a non-planar surface of the layer. The etching is such that the portion of exposed particles occupies a majority of a total area of a horizontal plane of the non-planar surface.

BRIEF DESCRIPTION OF DRAWINGS

The disclosure is described with reference to example embodiments and to the accompanying drawings, in which corresponding or like numbers or characters indicate corresponding or like structures.

DETAILED DESCRIPTION

The disclosure is based at least in part on the recognition that a composition of highly conductive particles suspended in a resin can provide a desirable combination of high thermal conductivity and flexible coupling of a semiconductor device to a packaging component. Unfortunately, merely forming a resin layer with such particles suspended therein may not provide the desired amount heat transfer. It was found, as part of this disclosure, that poor heat transfer to and from the particle-containing resin layer can be due to the surface of the layer being rich in resin. That is, the resin-rich surface can deter the efficient transfer of heat into or out of the layer. It was further discovered, as part of this disclosure, that removing portions of the resin at the surface, such that a portion of the particles are exposed at the surface, improves heat transfer.

Figure 1:
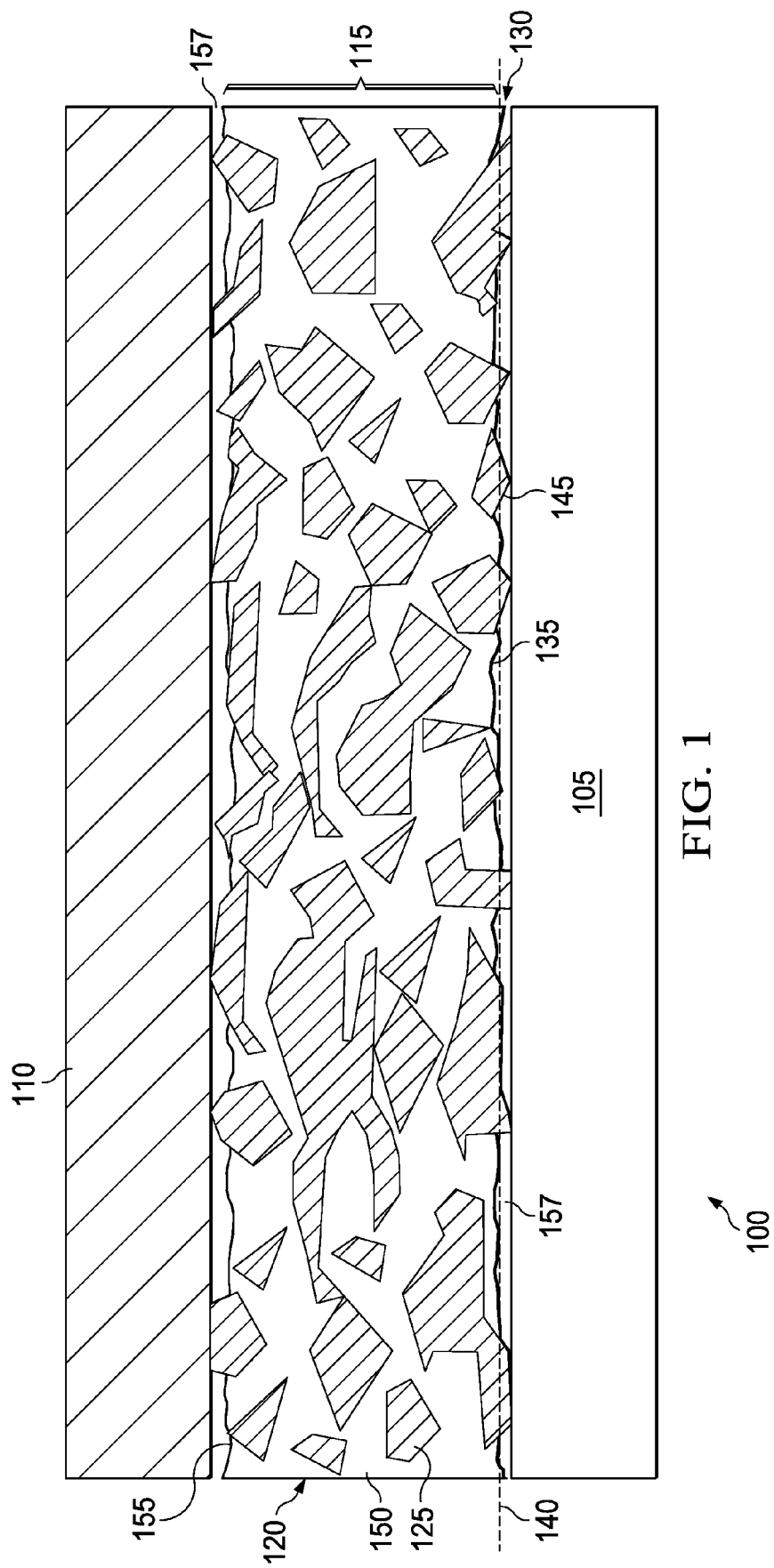
FIG. 1 illustrates a cross-sectional view of an example electronic device package of the disclosure.

FIG. 1 presents a cross-sectional view of an example electronic package 100 of the disclosure. The package 100 comprises a semiconductor device 105, a heat spreader layer 110 and a thermal interface material layer 115. The thermal interface material layer 115 is located between the semiconductor device 105 and the heat spreader layer 110. The material layer 115 includes a resin layer 120 having heat conductive particles 125 suspended therein. A portion 130 of the particles 125 are exposed on at least one non-planar surface 135 of the resin layer 120 such that the portion of exposed particles 130 occupies a majority of a total area of a horizontal plane 140 of the non-planar surface 135.

The horizontal plane 140 is a cross-section that is parallel to, and at the resin layer's 120 non-planar surface 135. The horizontal plane 140 cuts through the portion 130 of particles 130 that protrude above the non-planar surface 135 of the resin. E.g., a portion of the portion of the particle's 130 surface 145 is exposed. The horizontal plane 140 is equivalent to a 2-dimensional projection of the non-planar surface 135 of the resin layer 120.

The area occupied by exposed particles 130 in the horizontal plane 140 reflects the volume percent of the particles 125 in the resin layer 120. That is, when the volume percent of particles 125 in the resin layer 120 equals about 70 percent, then the area occupied by exposed particles 130 in the horizontal plane 140 is also about 70 percent. In some embodiments, it is advantageous for the percentage volume occupied by the particles 125 corresponds to at least about 70 percent of the total area of the horizontal plane being occupied by exposed particles 130. In some cases, percentage volume occupied by the particles 125 in the resin layer 120 ranges from about 70 to 90 percent, with a corresponding about 70 to 90 area occupied by exposed particles 130 in the horizontal plane 140.

The percent volume occupied by the particles 125 in the resin layer 120 is important, and in some cases critical, to the proper functioning of the thermal interface material layer 115. For instance, in some cases, for volume percentages of less about 70 percent, the extent of heat transfer through the resin layer 120 is less than desired to provide adequate heat dissipation for the semiconductor device 105 (e.g., devices of technology nodes of about 90 nanometers and lower). For instance, in some cases, for volume percentages of greater than about 90 percent, there can be insufficient amounts of resin (e.g., about 10 volume percent or less may be insufficient) to provide the resin layer 120 with a sufficient degree of flexiblity to allow the package 100 to tolerate thermal or mechanical stresses without operational failures.

The semiconductor device 105 can be an individual or a plurality of integrated circuit dies, or other active device, or passive devices (e.g., inductors, capacitors, resistors) in an integrated circuit die, or other electronic components well know to those skilled in the art.

The heat spreader layer 110 can be any structural component of the package that is directly coupled to the device 105 via the material layer 115, and that is configured to dissipate heat away from the device 105. In some cases, the heat spreader layer 110 is a lid that surrounds and protects the device 105. In other cases, the heat spreader layer 110 is a mounting body (e.g., an interposing substrate, or, a die mounting pad) that the device 105 is coupled to.

The resin material 150 of the resin layer 120 can comprise any thermoset or thermoplastic polymer that is capable of adhering the device 105 to the heat spreader 110, and that has flexibility in its cured state. For example, some embodiments of the resin material 150 is selected so as to have a Young's Modulus that is at least about 1/10 or lower than the Young's Modulus of the heater spreader layer 110, or other layer (e.g., heat conductive layers, as discussed below in the context of FIG. 2), that the resin layer 120 is adjacent to. In some cases, where the device 105 and heat spreader layer 110 have similar coefficients of thermal expansion (e.g., within about 10 percent), then the resin material 150 can be less flexible. Examples of suitable resin materials 150 include thermoset polymers such as epoxies, polyimides, acrylic, polyurethane, silicone, or thermoplastic polymers such as polyesters (e.g., MYLAR®).

The heat conductive particles 125 of the resin layer 120 can comprise any material having a thermal conductivity that is at least about 100 times or more greater than the thermal conductivity of the resin material 150. Some embodiments of the particles 125 comprise metals or metal alloys. Examples particle materials include silver, gold, copper, tin or alloys thereof. Other embodiments of the particles 125 can comprise non-metals, such as carbon nanotubes.

In some cases, the resin layer 120 consists essentially of the resin material 150 and heat conductive particles 125. E.g., at least about 99 volume percent of the resin layer 120 is composed of the resin material 150 and heat conductive particles 125. In some embodiments, the resin layer 120 comprises a majority volume percent (e.g., about 50 percent or more) of heat conductive particles 125, and balance resin material 150. In some preferred embodiments, the resin layer 120 comprises about 70 to 90 volume of heat conductive particles 125, and balance (e.g., about 30 to 10 percent, respectively) resin material 150.

Some embodiments of the heat conductive particles 125 have an average diameter of about 10 microns. In some embodiments, having particles 125 of a broad range of different sizes (e.g., diameters ranging from 2 to 25 microns) is desirable because this can facilitate having a higher volume percentage (e.g., about 85 to 90 volume percent) of particles 125 in the resin layer 120. In some cases, it is desirable for the particles to have an irregular non-spherical shape (e.g., an average long axis to short axis ratio ranging from about 2:1 or greater and in some cases about 5:1), because this can facilitate inter-particle contact and thereby promote heat transfer through the resin layer 120.

In some embodiments, the exposed particles contact one of the heat spreader layer or the semiconductor device. E.g., as shown in FIG. 1, the portion of exposed particles 130 directly contacts the heat spreader layer 110, which in this example, could be a lid or a mounting body. To further facilitate heat transfer, however, it is desirable for a second non-planar surface 155 of the resin layer 120 to also have the portion of exposed particles 130. As shown in FIG. 1, the second non-planar surface 155 is on an opposite side of the non-planar surface 135.

As shown in FIG. 1, when the particles 125 are irregular-shaped or are differently sized, the portion of exposed particles 130 can have an irregular surface 145. Although the device 105 or heat spreader layer 110 can directly contact some of the exposed particles 130 on this surface irregular surface 145, there can be a gap 157 between some exposed particles 130, or the non-planar surface 135, and the device 105 or heat spreader layer 110, thereby deterring optimal heat transfer.

Figure 2:
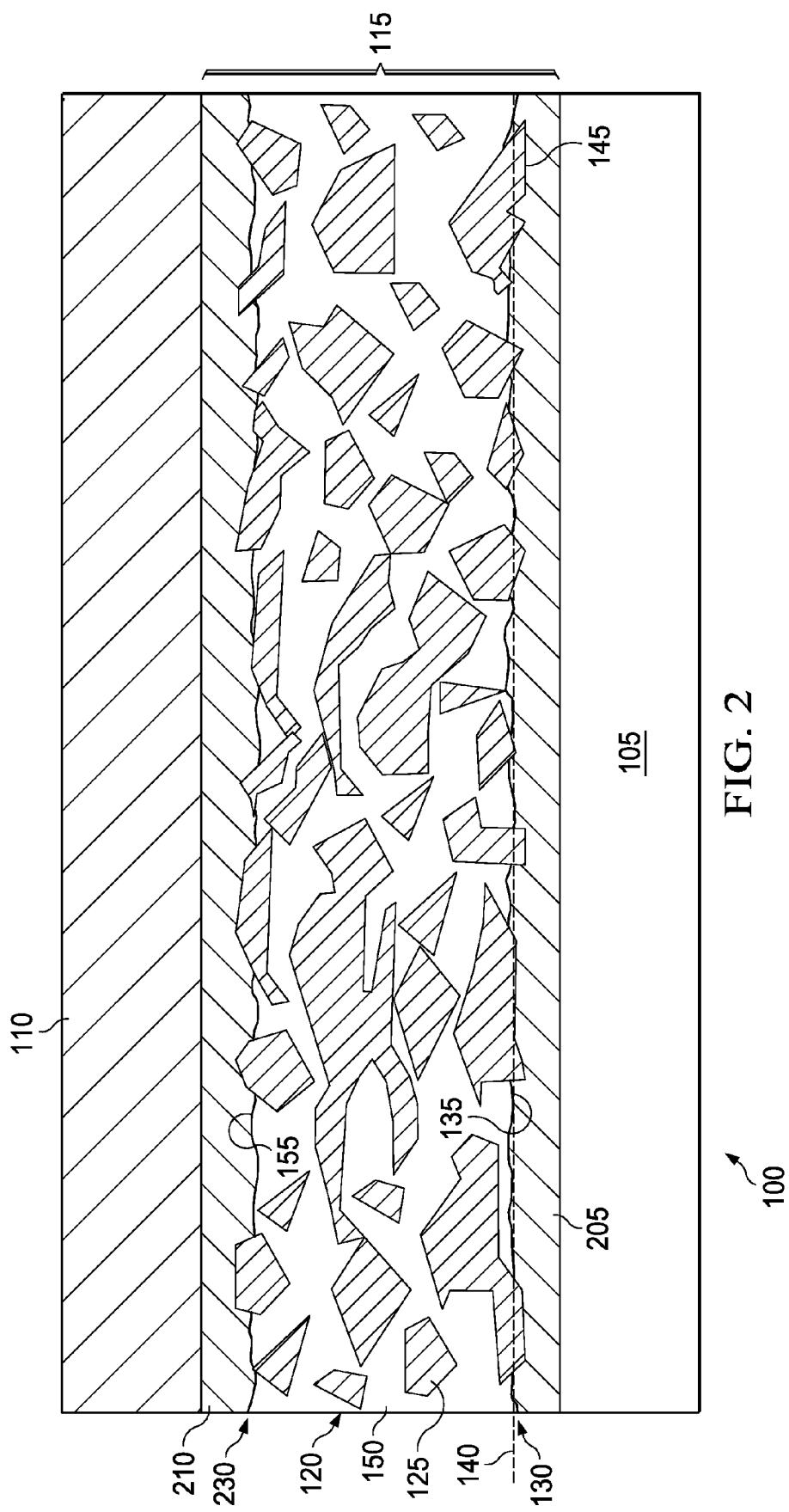
FIG. 2 illustrates a cross-sectional view of a second example electronic device package of the disclosure.

FIG. 2 shows a second example preferred embodiment of the package 100. To further enhance heat transfer, the thermal interface material layer 115 can include one or more heat conductive layers 205, 210 adjacent to the resin layer 120 and contacting the portion of exposed particles 130. The heat conductive layer 205 is configured to have more complete contact with the portion of exposed particles 130, as compared to contacting the exposed particles 130 directly to the device 105 or heat spreader layer 110. E.g., the heat conductive layer 205 can have direct contact with substantially the entire irregular surface 145 of the exposed particles 130, as well as the non-planar surface 135 of the resin layer 120. In comparison to the embodiment shown in FIG. 1, providing the heat conductive layer 205 to contact substantially all the layer 205 can improve heat transfer away from the device 105. E.g., in some cases, about 90 percent or more of the surface area of the particles 130 at or above the resin's non-planar surface 135 contact the heat conductive layer 205. In some cases, as illustrated in FIG. 2, there are substantially no gaps 157 (FIG. 1) between the resin layer 120 and the heat conductive layer 205.

In some embodiments, the heat conductive layer 205 comprises a solder material, or other metal or metal alloy having a similar thermal conductivity as solder. Some embodiments of the solder material can be reflowed at temperatures that do not disrupt the resin layer 120. An example solder material is tin-silver-copper alloy (SAC) solder (reflow temperature of about 220° C.), however, other types of solders could be used. By contacting the solder material to the exposed particles 130 of the resin layer 120 and then reflowing the solder, the heat conductive layer 205 can be configured to contact substantially all (e.g., about 90 percent or more) of the exposed particles 130. Moreover, the layer 205 comprising a reflowable material such as solder can form strong inter-metallic bonds with the exposed particles 130, to facilitate adhesion between the device 105 and the heat spreader layer 110.

As noted above, some embodiments of the resin material 150 have a Young's Modulus that is at least about $\frac{1}{10}$ or lower than the Young's Modulus that the resin layer 120 is adjacent to. When one or more heat conductive layers 205, 210 adjacent to the resin layer 120, then the resin material 150 can have a Young's Modulus that is at least about $\frac{1}{10}$ or lower than the Young's Modulus of the material that the heat conductive layers 205, 210 are composed of. For example when the heat conductive layers 205, 210 are composed of solder having a Young's Modulus of about 55 GPa, then some preferred embodiments of the resin material 150 have a Young's modulus of about 5.5 GPa or less.

It is desirable for one of the heat conductive layers 205 to contact the heat spreader layer 110 or the semiconductor device 105. In some embodiments of the package 100, to further facilitate heat transfer from the device 105, the thermal interface material layer 115 has two heat conductive layers 205, 210, which are outer layers, and the resin layer 120 is an interior layer. When there are two heat conductive layers 205, 210, it is desirable for the second layer 210 to contact the other of the heat spreader layer 110 or the semiconductor device 105. In the example shown in FIG. 2, the first heat conductive layer 205 contacts the heat spreader layer 110 and the second heat conductive layer 210 contacts the semiconductor device 105. The second layer 210 can contact an opposite surface 155 of the resin layer 120, the opposite surface 155 having a second portion of exposed portion particles 230.

Figure 3:
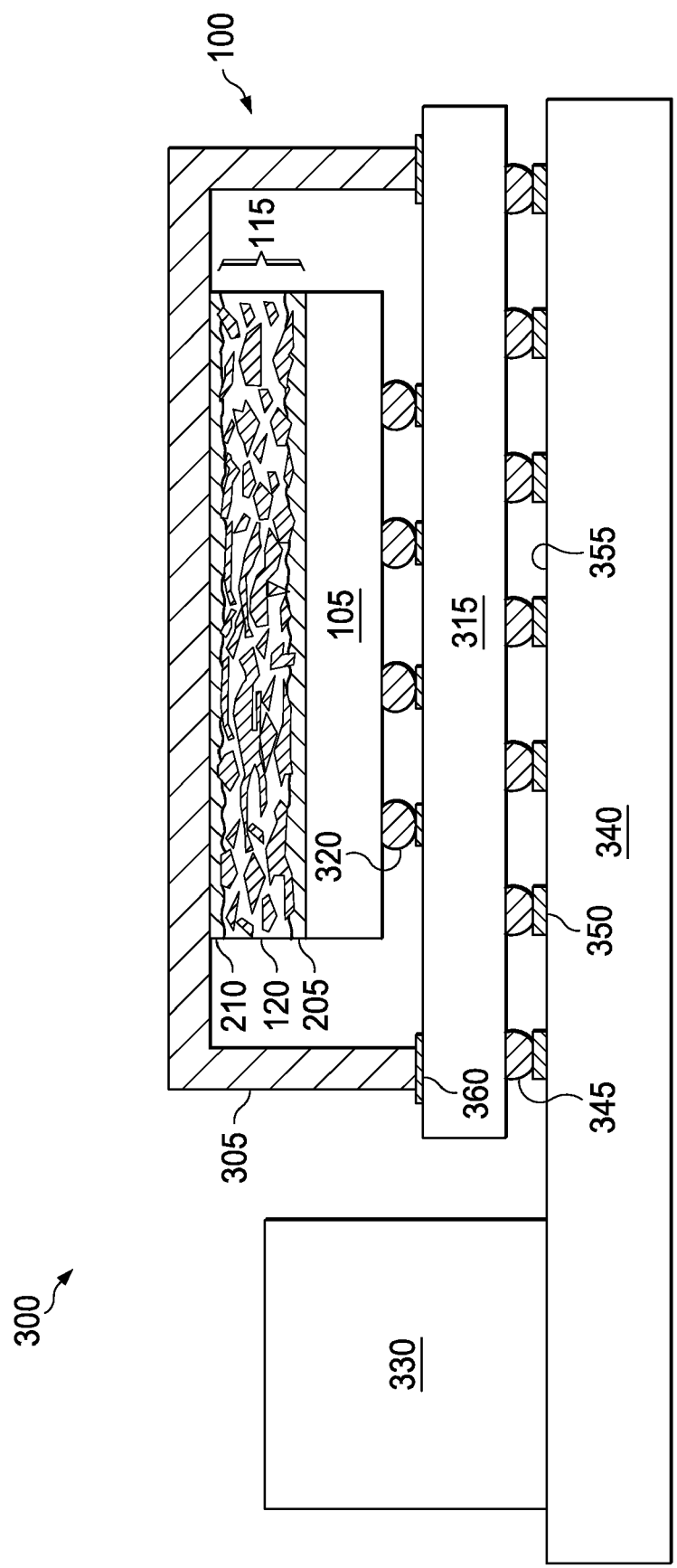
FIG. 3 illustrates a cross-sectional view of a electronic device having an example electronic device package of the disclosure.

FIG. 3 also illustrates another embodiment of the disclosure, an electrical device 300. The device 300 comprises the electronic package 100 that has the interface material layer 115, here, also shown with the heat conductive layers 205, 210. Example configurations of the electronic package 100 include power amplifiers, surface acoustic wave (SAW) filters, inductors, or other electrical devices used in digital signal processing systems.

The package 100 in FIG. 3 includes a lid 305 that surrounds the device 105 and the interface material layer 115. In such cases, the lid 305 can serve as the heat spreader layer 110 depicted in FIGS. 1-2. The above-described thermal interface material layer 115 is shown directly coupled to the device and lid 305 to facilitate the spread of heat to the lid 305.

Some embodiments of the package 100, such as depicted in FIG. 3 further include a mounting body 315, here configured as an interposer, or interposing substrate, that the semiconductor device 105 is mounted to. In some cases, the mounting body 315 can simply provide a secure mounting location for the device 105 and facilitate further heat dissipation from the device 105. In other cases, the mounting body 315 can further include a routing means (not shown) which facilitates connection of the device 105 to connective structures 320 of the package 100. For instance, the mounting body 315 can include a plurality of conventionally formed traces (not shown) that electrically couple the device 105 to connective structures 320.

In FIG. 3, the heat conductive layer 205 (e.g., an outer solder layer) is shown contacting the portion of exposed particles 130 (FIGS. 1 and 2) and the semiconductor device 105. In other cases, however, the heat conductive layer 205 could alternatively contact the lid 305. In still other cases, the thermal interface material layer 115 has a second heat conductive layer 210 (e.g., a second outer solder layer) that contacts one of the resin layer 120 or the lid 305.

As noted above, the device 300 includes connective structures 320. The connective structures 320 can be configured as, e.g., solder balls, solder columns, gold-stud bumps, conductive polymer bumps or other type of chip level connection that are internal to the package.

As also noted above, the connective structures 320 can be electrically coupled to the semiconductor device 105 via a routing means in the mounting body 315 to thereby interconnect the electronic package 100 to other electronic components 330 mounted on a substrate 340 (e.g., configured as a printed circuit board, PCB). E.g., second connective structures 345 can facilitate the connection of the mounting body 315 to conductive lines 350 located on a mounting surface 355 of the PCB 340. The second connective structures 345 can have the same, or a different, type of configuration as the connective structure 320. Example configurations of the second connective structure 345 include pins to form a pin grid array (PGA), solder balls to form a ball grid array (BGA), pads to form a landed grid array (LGA), a quad flat no-lead (QFN) array, or other leadless structures well known to those skilled in the art.

One skilled in the art would understand the other configurations connective structures could be used. Examples include plastic dual in-line integrated circuit packages (PDIP), small outline integrated circuits (SOICs), quad flat packages (QFPs), thin QFPs (TQFPs), Small Shrink Outline Plastic packages (SSOP), thin SSOPs (TSSOPs), thin very small-outline packages (TVSOPs), or other lead-containing packages well known to those skilled in the art.

Figure 4:
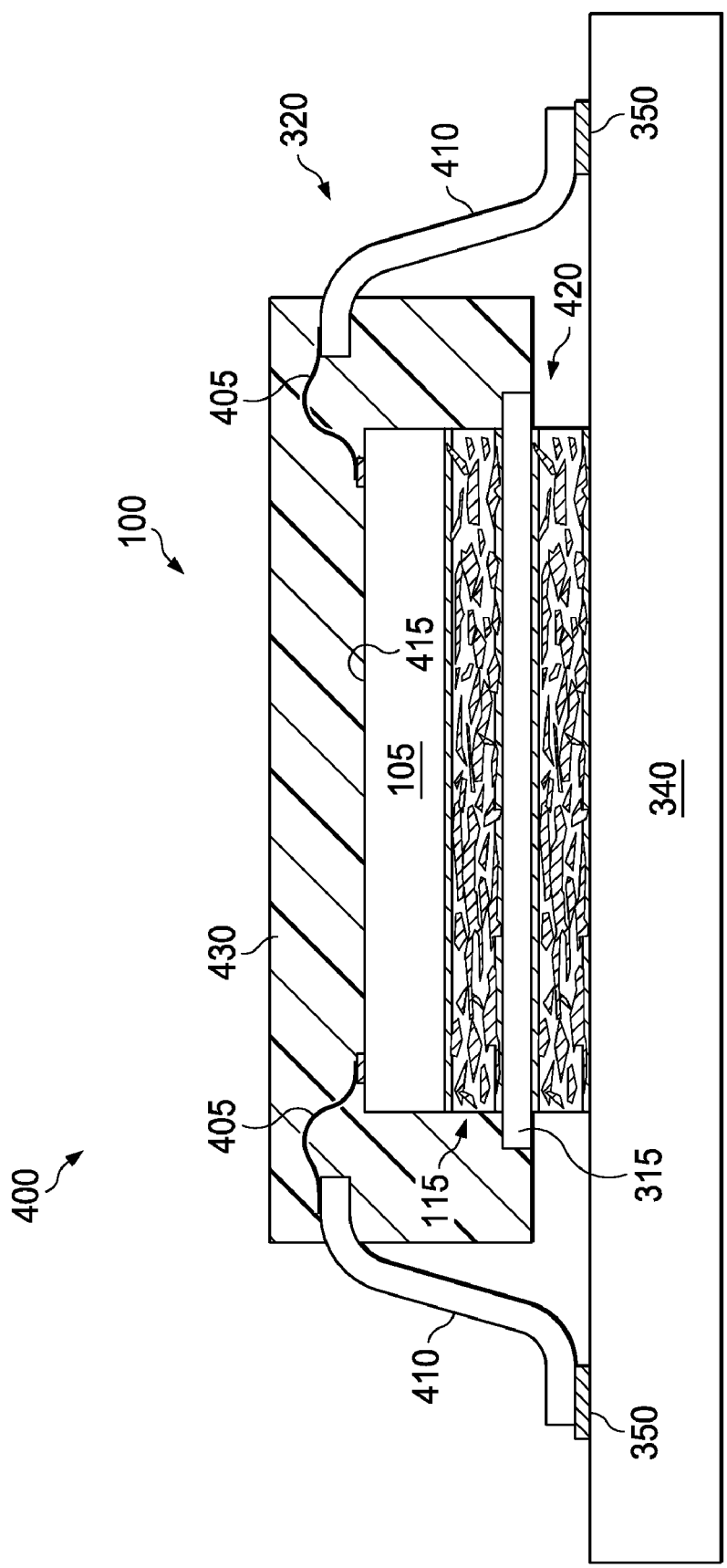
FIG. 4 illustrates a cross-sectional view of another electronic device having a second example electronic device package of the disclosure.

FIG. 4 also illustrates still another embodiment of the electrical device 400. In such embodiments, the mounting body 315, can be configured as a die mounting pad that the semiconductor device 105 is mounted to. In such cases, the mounting body 315 can serve as the heat spreader layer 110 depicted in FIGS. 1-2. In the embodiment depicted in FIG. 4, the package 100 can include connective structures 320 that comprise bonding wires 405 and leads 410 that facilitate coupling of the device 105 to other components (not shown) of the device 400. The die mounting pad 315 and leads 410 can both be formed from a lead frame using processes well known to those skilled in the art.

In cases where the bonding wires 405 are connected to a surface 415 of the device 105 that the mounting body 315 (e.g., a die mounting pad) is not coupled to, a thermal interface material layer 115 can be uniformly distributed between the device 105 and pad 315. Additionally, in some embodiments, a second thermal interface material layer 420 can be used to adhere the mounting body 315 to the substrate 340 (e.g., PCB). That is, the second thermal interface material layer 420 can be located between the device 105 and the substrate 340 (e.g., PCB). Some embodiments can further include a mold 430 (e.g., a plastic) that conformally covers the device 105 and mounting body 315. As shown in FIG. 4 the mold 430 can encompass the wires 405 and portions of the leads 410. Portions of the mold 430 can be removed to allow the second thermal interface material layer 420 to be directly coupled to the mounting body 315.

One skilled in the art would understand that there are numerous package configurations that could include one or more of the above-described thermal interface material layers to advantageously adhere various components of the package together and to improve heat dissipation from semiconductor devices of the package.

As further shown in FIG. 3, the second connective structures 345 can be bonded (e.g., via soldering) to the mounting surface 355 of the substrate 340 (e.g., PCB) having the conductive lines 350. The conductive lines 350 can connect the package 100 to other electronic components 330 of the package 100. The other electronic components 330 can comprise electronic packages similar to that described above for the electronic package 100, or other integrated circuits configured to, e.g., control the device's power management, serve as memory storage, or perform other functions. In some cases, such as when the lid 305 comprises a metal, the lid 305 can also be bonded to ground connections 360 on the mounting body 315. Grounding the lid 305 in this fashion can facilitate the suppression of electromagnetic interference between the device 105 and other electronic components 330 of the electrical device 300.

Figure 5:
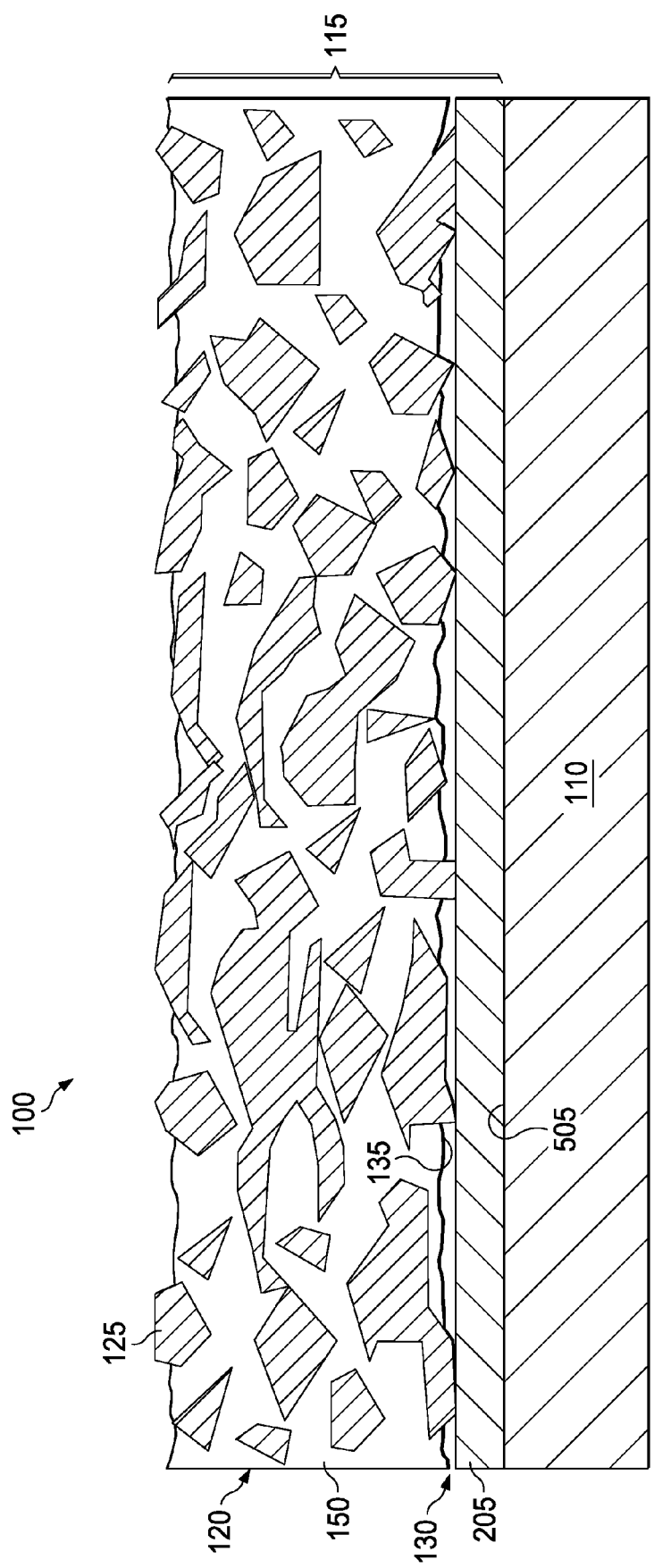
FIGS. 5 to 7 illustrate cross-section views of selected steps in example implementation of a method of fabricating an electronic device package according to the principles of the present disclosure.
Figure 6:
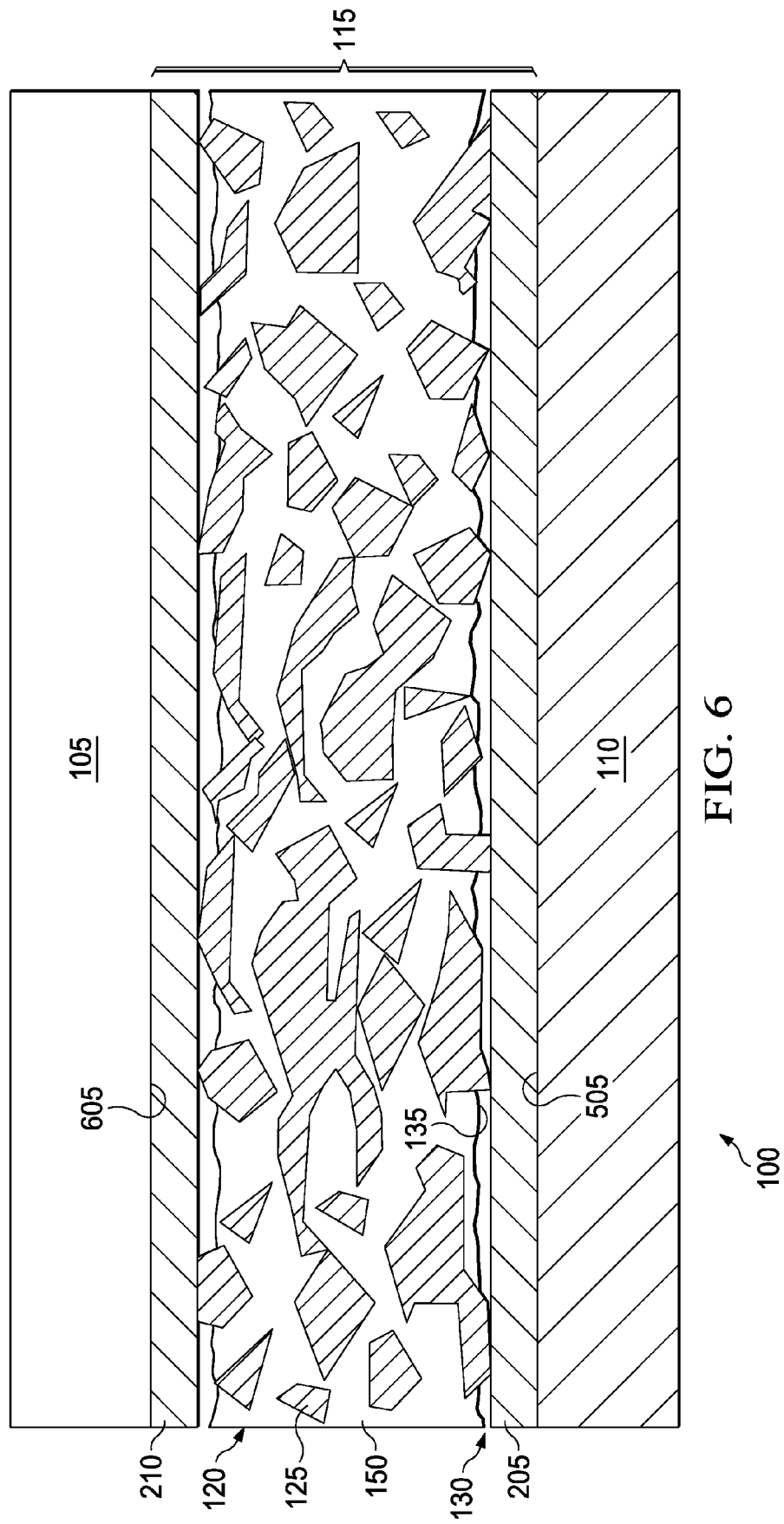
Figure 7:
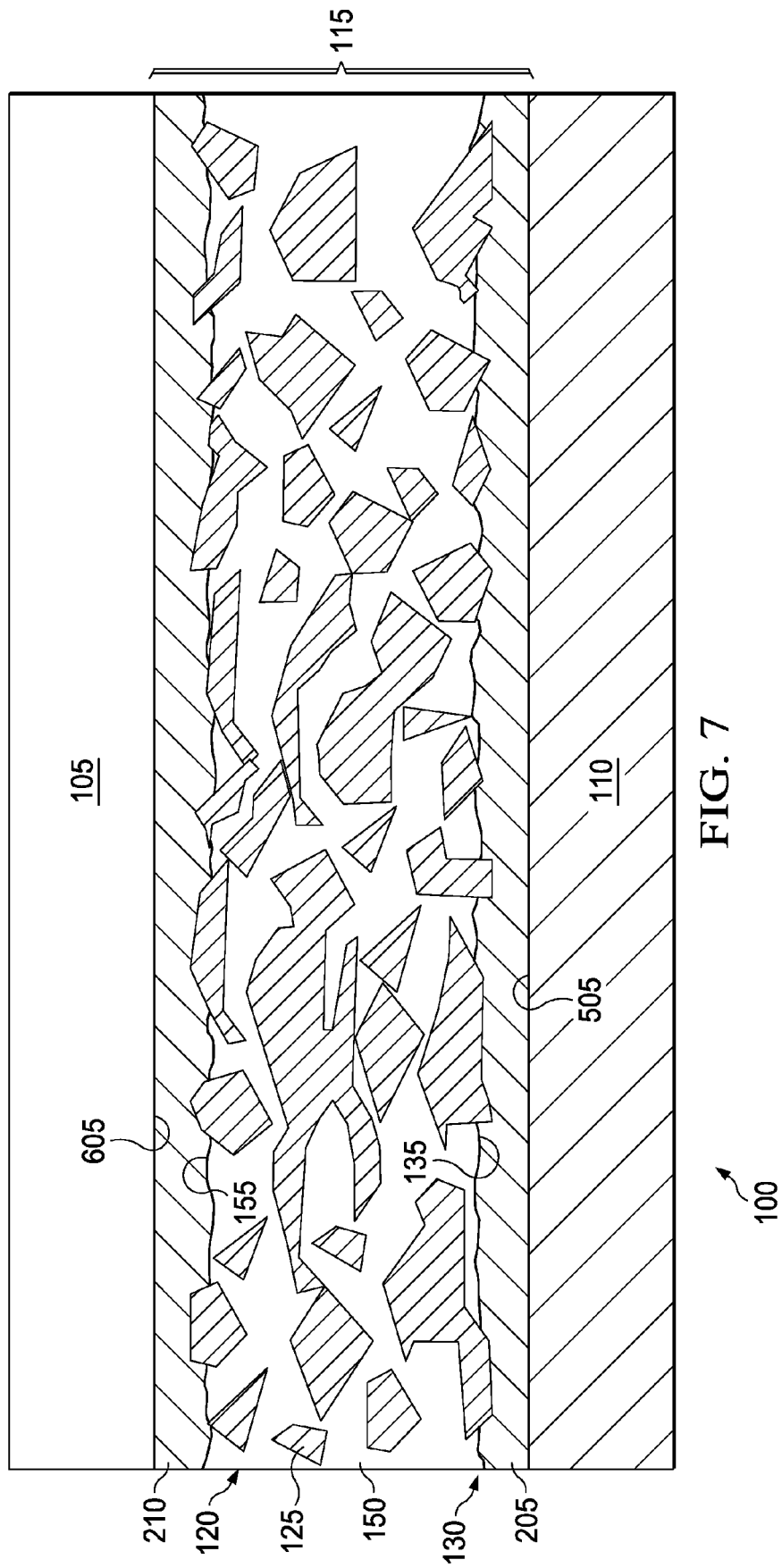

Another aspect of the disclosure is a method of manufacturing an electronic package. FIGS. 5-7 illustrate cross-sectional views of selected steps in an example method of manufacturing an electrical package 100 of the disclosure. Any of the embodiments of the electronic package 100 discussed in the context of FIGS. 1-4 can be manufactured by the method.

The method of manufacturing the package includes attaching a semiconductor device to heat spreader layer (e.g., a die mounting pad). Attaching the device including applying a thermal interface material to a component surface of one of the semiconductor device or heat spreader layer. For instance, FIG. 5 shows the example package 100, similar to that depicted in FIGS. 1 and 2, after applying a thermal interface material 115 to a component surface 505 of a heat spreader layer 110. As discussed above in the context of FIG. 1, the thermal interface material 115 includes a resin layer 120 having heat conductive particles 125 suspended therein, and a portion 130 of the particles 125 are exposed on at least one non-planar surface 135 of the resin layer 120.

FIG. 5 also illustrates that, in some cases, applying the thermal interface material 115 includes depositing a heat conductive layer 205 on the component surface 505 before applying the resin layer 120 to the component surface 505. For instance, a heat conductive layer 205 comprising solder can be plated on the component surface 505 using conventional electroless or electrochemical processes. In such cases, the resin layer 120 is deposited directly on the heat conductive layer 205 instead of directly on the component surface 505.

In some cases, the resin layer 120 is a preformed layer that is applied directly to the component surface 505 or, as shown, to the heat conductive layer 205 on the component surface 505. In other cases, the resin layer 120 is formed on the component surface 505 (with or without the heat conductive layer 205 in place). E.g., a liquid or paste of the resin material 150 and particles 125 can be deposited on the surface 505, and then mechanical pressure can be applied to form the resin layer 120 over the surface 505. In some cases, the mechanical pressure can be from contacting the other of the semiconductor device or heat spreader layer to the liquid or paste. However, alternative means (e.g., rollers, spray or spin coating) can be used to form the resin layer 120.

FIG. 6 shows the package 100 after depositing a second heat conductive layer 210 on the resin layer 120. In this example, the second heat conductive layer 210 is deposited on the resin layer 120 after the resin layer 120 has already been applied to the component surface 505 (with or without the heat conductive layer 205 in place).

The second heat conductive layer 210 can comprise the same or different material as the first heat conductive layer 205, and can be deposited on the other of the device or heat spreader layer using the same or different plating process as used to deposit the first layer 205. For instance, for the embodiment shown in FIG. 6 the second heat conductive layer 210 is plated on to a surface 605 of the device 105 before being deposited on the resin layer 120.

In other embodiments, the thermal interface material 115 is a pre-formed layer comprising an inner resin layer 120 and two outer heat conductive layers 205, 210 that are applied to the component surface 505, resulting in a structure similar to that shown in FIG. 6.

Attaching the semiconductor device to the heat spreader layer also includes contacting the other of the semiconductor device or the heat spreader layer to the thermal interface material. For instance, FIG. 6 shows the package 100 after contacting the device 105 to the thermal interface material 115.

In some cases, such as shown in FIG. 7, attaching the device 105 to the heat spreader layer 110 includes heating the package 100. Heating can improve the adhesion of the thermal interface material 115 the device 105 and heater spreader layer 110. Heating can facilitate the formation of strong intermetallic bonds between the exposed particles 130 and the heat conductive layers 205, 210, or, between the heat conductive layers 205, 210 and device 105 or heat spreader layer 110. In some cases, the heating is sufficient to cause the heat conductive layers 205, 210 to reflow. E.g., in some embodiments heating raises the peak temperature of the package 100 to about 200 to 250° C. for about 15 to 30 seconds. Heating can also enhance the adhesion of the resin material 150 to the device 105, heat spreader layer 110, or heat conductive layers 205, 210.

One skilled in the art would appreciate how the manufacture of the package 100 could further include attaching a second thermal interface material (e.g., second thermal interface material 420 in FIG. 4) to an opposite non-planar surface 155 of the semiconductor device 105, or, to a layer coupled to this surface (e.g., the mounting body 315 in FIG. 4), and attaching a second heat spreader layer (e.g., the mounting body 315 in FIG. 4) to the opposite surface 155 (FIG. 2) to the opposite surface 155. One skilled in the art would also appreciate how the manufacture of the package could further include coupling connective structures (e.g., connective structure 320 in FIG. 3 or bonding wires 405 and leads 410 in FIG. 4) to conductive lines 350 (FIGS. 3 and 4) of the package 100.

Figure 8:
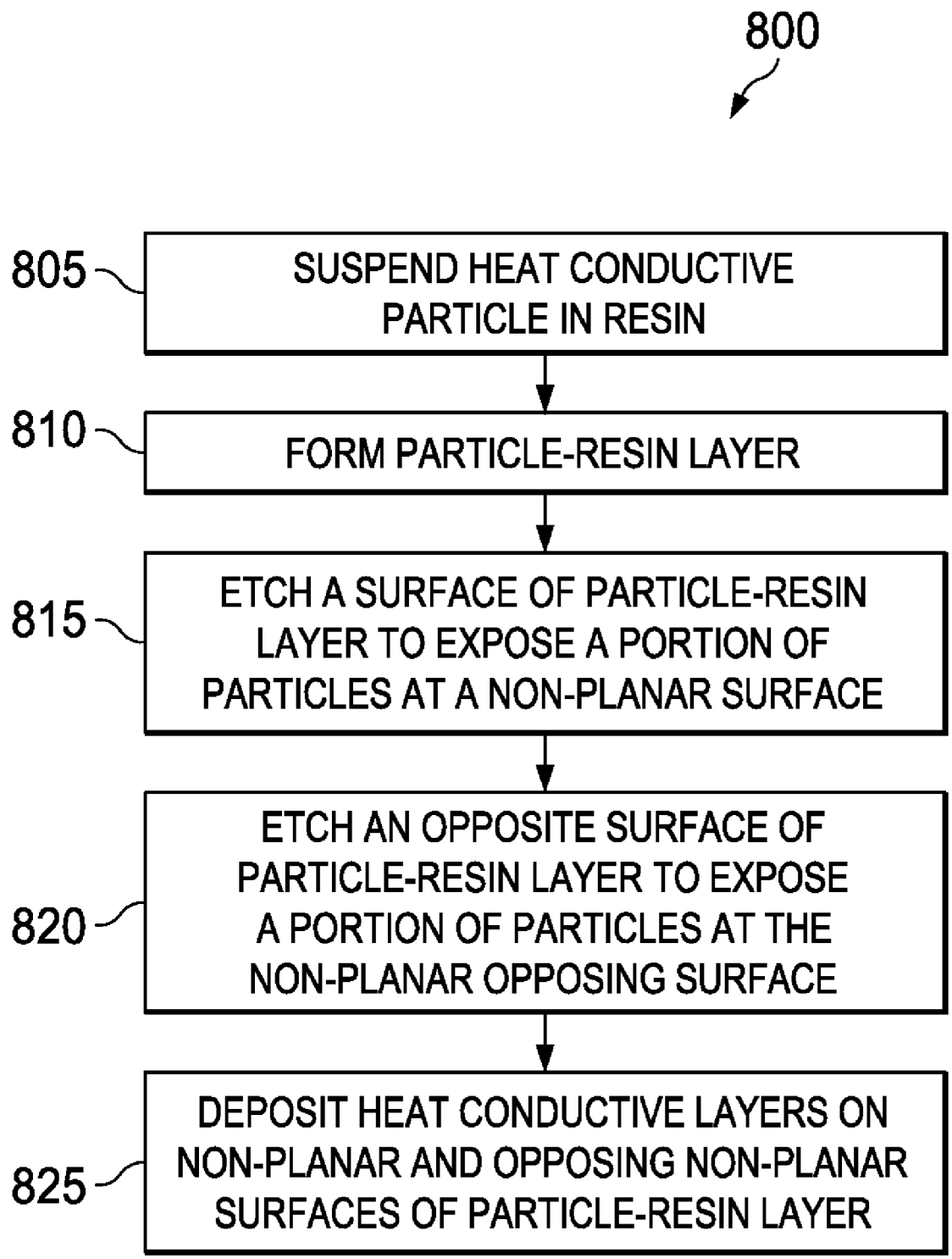
FIG. 8 presents a flow diagram of an example method of manufacturing a thermal interface material according to the principles of the present disclosure.

Another aspect of the disclosure is a method of forming the thermal interface material layer. FIG. 8 presents a flow diagram to illustrate selected steps in an example method 800 of forming an example thermal interface material layer. The method 800 comprises a step 805 of suspending heat conductive particles in a resin (e.g., particles 125 in resin material 150, FIG. 1) to form a particle-resin mixture. E.g., metal particles can be stirred into a liquid uncured resin or partially cured resin (e.g., A-stage or resol curing).

The method 800 also comprises a step 810 of forming a layer of the particle-resin mixture. E.g., a partially cured (e.g., B-stage or resolite curing) or a hot-melt of the metal-resin mixture can be shaped into a layer using thermoforming processes such as extrusion coating, roll coating injection molding or other process well known to those skilled in the art. The layer at this stage of the method 800 has a substantially planar surface.

The method 800 further comprises a step 815 of etching the planar layer and therefore expose a portion of the particles located at the now non-planar surface of the layer (e.g., exposed particles 130 at the non-planar 135 surface of resin layer 120, FIG. 1). For instance, after the layer has cured (C-stage or resite curing) the layer can be exposed to a chemical or plasma etch such that resin material at the planar surface of the layer are removed, thereby forming the non-planar surface and exposing the particles. When etching is completed, the exposed particles occupy occupies a majority of a total area of a horizontal plane of the non-planar surface (e.g., horizontal plane 140 as non-planar surface 135, FIG. 1).

One example etch process can comprise laser ablation to expose the filler particles. Another example etch process can comprise exposure to an oxygen plasma with $SF_6$ to etch a resin layer comprising an epoxy polymer. One skilled in the art would be familiar with other etch processes, such as chemical etch processes, that could also be used.

In some embodiments, an opposing surface of the layer (e.g., surface 155 of resin layer 120, FIG. 2) is also etched, in step 820, to expose the portion of particles at the opposing non-planar surface (e.g., exposed particles 230 at non-planar surface 155, FIG. 2). E.g., the same process (step 815) use to etch the first surface of the layer can also be used to etch the opposing surface.

In some embodiments, heat conductive layers are deposited, in step 825, on at least one, and in some cases, also on the opposing surfaces of the particle-resin layer, which have the portion of exposed particles (e.g., both surfaces 135, 155, FIG. 2). E.g., in some cases a solder can be plated on the non-planar surface and the opposing non-planar surfaces.

Those skilled in the art to which the disclosure relates will appreciate that other and further additions, deletions, substitutions, and modifications may be made to the described example embodiments, without departing from the disclosure.

We claim:

1. An electrical device, comprising:
a semiconductor device mounted to a mounting body;
a lid surrounding said semiconductor device; and
a thermal interface material layer located between said semiconductor device and at least one of said lid, wherein said thermal interface material layer includes:
an resin layer having un-melted metal particles suspended therein, a portion of said un-melted metal particles being exposed on at least one non-planar surface of said resin layer such that said portion of exposed un-melted metal particles occupy a majority of a total area of a horizontal plane of said non-planar surface, and
an outer solder layer contacting said non-planar surface and the semiconductor device; and
connective structures electrically coupled to said semiconductor device to thereby interconnect said electronic package to electronic components mounted on a substrate.

2. The device of claim 1, further including a second outer solder layer contacting an opposite non-planar surface of said resin layer, wherein said non-planar opposite surface includes a second said portion of exposed particles.

3. The device of claim 1, further including a second said thermal interface material layer located between said semiconductor device and said substrate.

4. An electrical device, comprising:
a semiconductor device attached to a metallic lid with a thermal interface, in which the interface material layer includes:
an resin layer having un-melted metal particles suspended therein, a portion of said un-melted metal particles being exposed on at least one non-planar surface of said resin layer such that said portion of exposed un-melted metal particles occupy a majority of a total area of a horizontal plane of said non-planar surface, and
a solder layer contacting said non-planar surface and the lid.

5. The electrical device of claim 4, in which the further comprising a second solder layer contacting a second non-planar surface of said resin layer opposite the at least one non-planar surface.

6. The electrical device of claim 5, in which the second solder layer contacts the semiconductor device.

7. The electrical device of claim 6, further comprising a metal layer between the semiconductor device and the solder layer.

8. The electrical device of claim 4, in which the lid is connected to an electrical ground.

9. The electrical device of claim 8, in which the lid is connected to an electrical ground through a substrate on which the semiconductor device is affixed.

10. The electrical device of claim 9, in which the substrate is further affixed to a printed circuit board with solder material.

11. The electrical device of claim 4, in which the edges of the resin layer and the edges of the semiconductor device are co-extensive.

12. The electrical device of claim 4, in which the lid surrounds the semiconductor device.

13. The electrical device of claim 12, in which the surrounding portion of the lid extending downward form a top portion towards the substrate.

14. The electrical device of claim 13, in which semiconductor device is affixed to the top portion of the lid.

* * * * *